United States Patent [19]

Malhi et al.

[11] Patent Number: 5,031,072
[45] Date of Patent: Jul. 9, 1991

[54] BASEBOARD FOR ORTHOGONAL CHIP MOUNT

[75] Inventors: Satwinder S. Malhi, Garland; Kenneth E. Bean, Richardson, both of Tex.

[73] Assignee: Texas Instruments Incorporated, Dallas, Tex.

[21] Appl. No.: 472,698

[22] Filed: Jan. 31, 1990

Related U.S. Application Data

[63] Continuation of Ser. No. 893,770, Aug. 1, 1986, Pat. No. 4,922,378.

[51] Int. Cl.⁵ .............................................. H05K 7/20
[52] U.S. Cl. .................................... 361/387; 361/393; 357/55; 357/75; 357/81
[58] Field of Search ............... 361/307, 393, 394, 396, 361/388, 387, 400, 401, 412, 413, 414; 357/55, 59 F, 68, 75, 80, 81

[56] References Cited

U.S. PATENT DOCUMENTS

| | | | |
|---|---|---|---|
| 2,951,184 | 8/1960 | Wyma | 361/412 X |
| 3,105,869 | 10/1963 | Branch et al. | 361/412 X |
| 3,271,507 | 9/1966 | Elliott | 357/68 X |
| 3,414,892 | 12/1968 | McCormack et al. | 361/412 X |
| 3,514,538 | 5/1970 | Chadwick et al. | 361/387 X |
| 3,631,325 | 12/1971 | Wenz | 361/387 |
| 3,694,669 | 9/1972 | Synder et al. | 361/387 |
| 3,899,720 | 8/1975 | Peterson | 361/412 |
| 3,949,274 | 4/1976 | Anucker | 361/393 |
| 4,109,299 | 8/1978 | Cosentino et al. | 361/412 |
| 4,328,530 | 5/1982 | Bajorek et al. | 361/401 |
| 4,401,351 | 8/1983 | Record | 361/393 X |
| 4,495,378 | 1/1985 | Dotzer et al. | 361/387 X |
| 4,495,546 | 1/1985 | Nakamura et al. | 361/412 X |
| 4,551,747 | 11/1985 | Gilbert et al. | 361/414 X |
| 4,630,172 | 12/1986 | Stenerson et al. | 361/414 X |
| 4,922,378 | 5/1990 | Malhi et al. | 361/387 |

OTHER PUBLICATIONS

Henle, "Vertical Chip Packaging", *IBM Technical Disclosure Bulletin*, vol. 20, No. 11A, (Apr. 1978), pp.4339-4340.

*Primary Examiner*—William M. Shoop, Jr.
*Assistant Examiner*—A. Jonathan Wysocki
*Attorney, Agent, or Firm*—James C. Kesterson; James T. Comfort; Melvin Sharp

[57] ABSTRACT

A baseboard for orthogonal mounting of integrated circuit chips thereto is described. Plural channels (14) are anisotropically etched in a silicon baseboard (10). A corresponding plurality of integrated circuit chips (12) are inserted into the channels (14). A number of baseboard contact pads (18) are formed adjacent each channel (14), and are solder bonded to corresponding chip conductor pads (16). Interconnect conductors (20, 28) provide connection of each baseboard pad (18) either to other chips (12) or to connector pads (22) located adjacent an edge (26) of the baseboard chip mount (10). A coating (30) of silicon carbide over the surface of the baseboard chip mount (10) improves the thermal efficiency of the assembly.

8 Claims, 4 Drawing Sheets

BASEBOARD FOR ORTHOGONAL CHIP MOUNT

RELATED APPLICATION

"High Density Micropackage for IC Chips", by Pallab K. Chatterjee, filed concurrently herewith, Ser. No. 892,224, now U.S. Pat. No. 4,695,872. This is a continuation, of U.S. application Ser. No. 06/893,770, filed Aug. 1, 1986, now U.S. Pat. No. 4,922,398.

TECHNICAL FIELD OF THE INVENTION

The present invention relates in general to electrical packaging methods and apparatus, and more particularly relates to methods and apparatus for mounting integrated circuit chips orthogonally to a baseboard.

BACKGROUND OF THE INVENTION

While substantial innovations have been made in packaging semiconductor components and devices, there is a current need for more efficient and economical packaging techniques. For example, the miniaturization and thermal dissipation characteristics of presently available packaging techniques are not adequate to fully take advantage of the inherent performance characteristics of current submicron devices.

Further, with the emergence of very large scale integrated (VLSI) circuits, it becomes necessary for system integration development to package such circuits together so as not to compromise the advancements in circuit integration. Currently, VLSI circuits, such as the one megabit random access memory circuits, are packaged in a plastic or ceramic encapsulant and are available either as a dual inline package or as a leadless chip carrier. Both of these approaches address the packaging problems of single integrated circuit chips, but do not pose solutions to system integration and/or packaging of multiple chips.

From the foregoing, it can be seen that a need exists for an innovative system integration, or packaging technique to complement the corresponding advances in the miniaturization of the device technology. There is an associated need for new packaging apparatus and techniques for integrating together multiple integrated circuit chips in a three dimensional manner so as to provide a highly efficient, economical and compact arrangement, while yet providing adequate thermal dissipation required for densely packed electrical circuits.

SUMMARY OF THE INVENTION

In accordance with the present invention, an improved apparatus and method of system integration for packaging integrated circuit chips is disclosed which reduces or eliminates the disadvantages and shortcomings associated with the prior art packaging techniques. According to the invention, a baseboard chip mount is provided with a plurality of channels formed in a planar face thereof, each such channel receiving and holding an integrated circuit chip. The channels may be anisotropically etched in a silicon baseboard material to form nearly vertical sidewalls. A number of integrated circuit chips can then be inserted into the channels and orthogonally mounted to the baseboard. A packaging density of an order of magnitude better than conventional methods can thus be realized.

Electrical and thermal contact between the integrated circuit chip and the baseboard is made by forming conductive solder pads along the edge of each channel, and then reflowing each solder pad to a respective metallic pad on the chip. External electrical connection can be made to the baseboard chip mount by providing a number of connector pads along an edge of the baseboard so that a bayonet type connector, or other similar connecting device, can be slipped over the edge of the baseboard to engage the connector pads. Interconnect conductors are formed on the silicon baseboard for connecting the solder pads to desired ones of the connector pads.

Electrical connection can be made to the backside of the integrated circuit chips by forming contact pads adjacent the opposing edge of each such channel. A solder fillet between these pads and the chip provides an electrical connection as well as additional mechanical support to the chips. Electrical connections to the backside of the chips can enhance the latch-up immunity of CMOS type integrated circuits.

A silicon carbide layer may be deposited conformally on the baseboard to increase the efficiency with which heat is transferred from each integrated circuit chip to the baseboard, and thus dissipated to the ambient air.

The top planar surface of the baseboard chip mount may be passivated with a layer of silicon dioxide or silicon nitride which isolates the interconnect conductors. Another such layer may overlie the interconnects for ambient passivation. Additional channels can be formed on the undersurface of the baseboard, which may also be coated with silicon carbide, to increase the surface area for heat dissipation.

BRIEF DESCRIPTION OF THE DRAWINGS

Further features and advantages will become more apparent from the following and more particular description of the preferred embodiment of the invention, as illustrated in the accompanying drawings in which like reference characters refer to the same parts throughout the views, and in which.

DETAILED DESCRIPTION OF THE INVENTION

Figure 1:
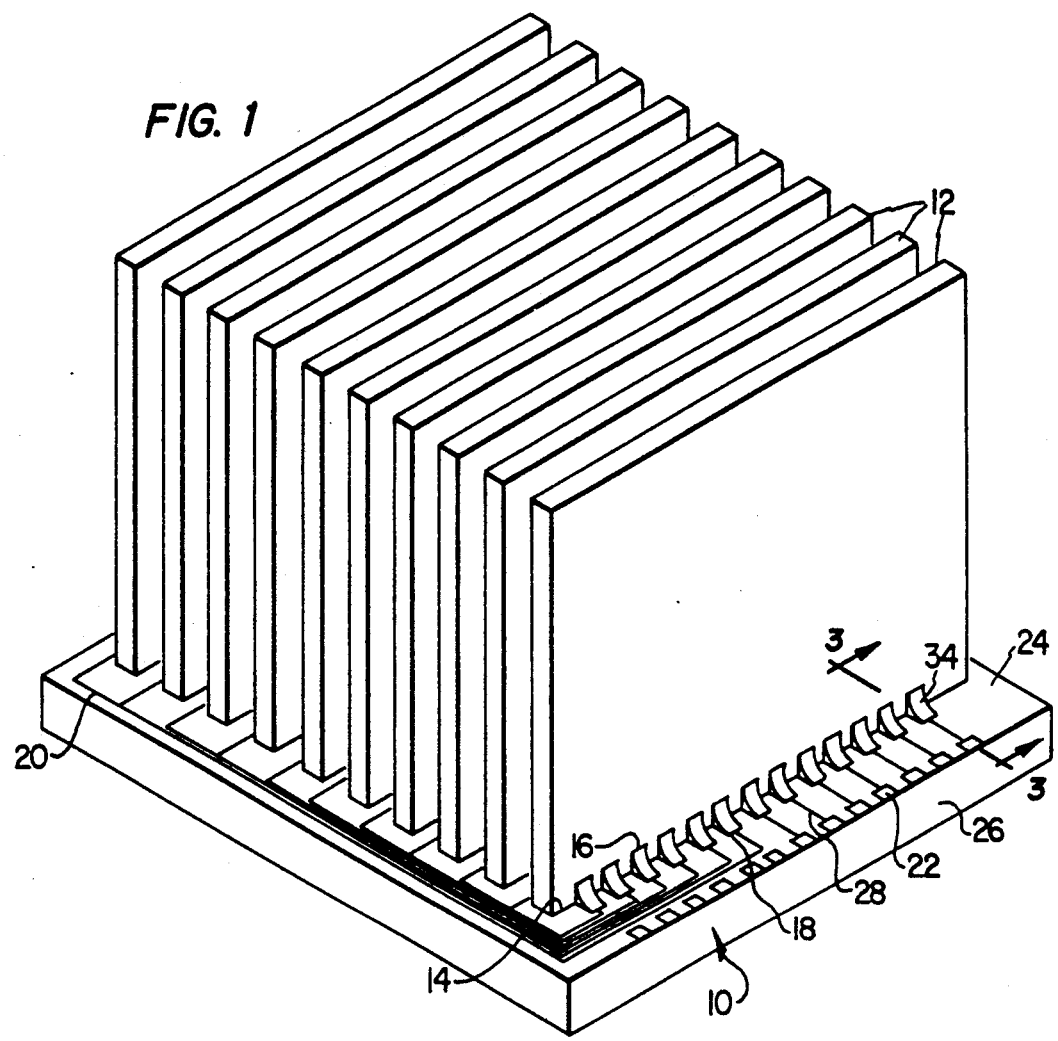
FIG. 1 is an isometric view of a baseboard chip mount, constructed in accordance with the invention, and to which multiple integrated circuit chips are orthogonally mounted.

The principles and concepts of the invention are best understood by referring first to FIG. 1 of the drawings where there is shown a completely assembled baseboard chip mount 10 with a number of integrated circuit chips 12 mounted orthogonally thereon. As can be seen, the baseboard chip mount 10 is only slightly larger in area than each of the integrated circuit chips 12. In the preferred form of the invention, and according to current device technology wherein integrated circuit chips have dimensions of about 1 cm. by 1 cm., a baseboard chip mount 10 of comparable size can accommodate, for example, ten integrated circuit chips. Even taller integrated circuit chips 12 may be accommodated by the chip mount 10, as such chips merely extend further away from the baseboard chip mount 10.

The baseboard chip mount 10 includes a number of parallel slots or channels 14 for receiving edges of the integrated circuit chips 12. As will be described in more detail below, each channel 14 is dimensioned to snugly accommodate a small edge portion of a respective integrated circuit chip 12, such that chips 12 may be mounted in the spaced apart parallel configuration shown in FIG. 1.

Each integrated circuit chip 12 may include a metallic chip pad 16 near its lower edge for providing either input signals, output signals or power or ground to the integrated circuit chip 12. The baseboard chip mount 10 is provided with a corresponding number of surface conductive solder pads 18 which are spaced apart from each other to match and contact chip pads 16. Thus, when an integrated circuit chip 12 is inserted into its respective baseboard channel 14, the chip pads 16 become adjacent with and contact the corresponding baseboard electrical pads 18. A solder connection 34 between the chip pads 16 and the baseboard pads 18 forms both an electrical connection therebetween, and also support for fixing the chip 12 to the baseboard chip mount 10. Additional unused chip pads soldered to baseboard pads can be utilized for purposes of providing thermal conductive paths from the chips 12 to the baseboard 10. The baseboard is also suitable for mounting to a heat sink, if necessary.

An advantage of the present mount is that no external electrical connections, other than through the baseboard chip mount 10, need be made to any of the integrated circuit chips 12. Various ones of the chip pads 16 may be connected by conductive interconnect lines 20 to the chip pads of one or more of the other integrated circuits fixed within the baseboard chip mount 10. Depending upon the type of integrated circuit chip 12 utilized with the baseboard chip mount 10, the interconnect lines 20 may form signal or power interconnects between the various integrated circuit chips 12, or may form address, data, etc. buses coupling each of the chips 12 together.

A number of surface connector pads 22 are provided on the top planar face 24 of the baseboard chip mount 10, near one or more side edges thereof. For purposes of example only, and for clarity of the drawings, the connector pads are shown adjacent baseboard edge 26. Also, while some of the connector pads are shown unused to simplify the interconnect line 20 pattern, in practice, such pads could be located adjacent an edge of the baseboard 10 which is centrally located to the chips to which the pads would be connected. This shortens the lead length of the interconnect lines 20 and allows high speed transmission of signals carried by the lines. Each connector pad 22 may be connected to one or more baseboard pads 18 by an interconnect conductor 28. External electrical connection can thus be made to any integrated circuit chip 12 through one or more of the connector pads 22.

As will be subsequently shown in FIGS. 2-4, a desired surface area of the baseboard chip mount 10 may be covered by a high thermally conductive material to dissipate heat transferred from the integrated circuit chips 12 to the baseboard chip mount 10. The baseboard chip mount 10 thus functions as a heat sink to reduce the operating temperature of the integrated circuit chips 12. Also, with the orthogonal mounting technique, the ambient fluid, e.g., air, is free to circulate, or be forced, in the spaces between the integrated circuit chips 12. Other coolant fluids including helium or hydrogen can be used.

As shown in FIG. 1, advantage is taken of the third dimension in achieving an innovative package for integrated circuit chips. Very large scale integration circuits, including, for example, one megabit dynamic random access memories, may now be packaged together in a volume not much larger than the dimensions of the baseboard chip mount 10 and the height of the integrated circuit chips 12. According to current semiconductor device technology, integrated circuit chips are about 500 micrometers thick, thus requiring a baseboard channel of corresponding width. With an additional 500 micrometer space between each integrated circuit chip 12, about ten such chips 12 can be orthogonally mounted in the respective channels 14 of a one centimeter by one centimeter baseboard chip mount 10. The 500 micrometer spacing between the chips 12 can be used to run the interconnect lines 20 between the chips 12. Such an arrangement utilizes a volume of about one cubic centimeter, thereby greatly improving the packaging density.

Figure 2:
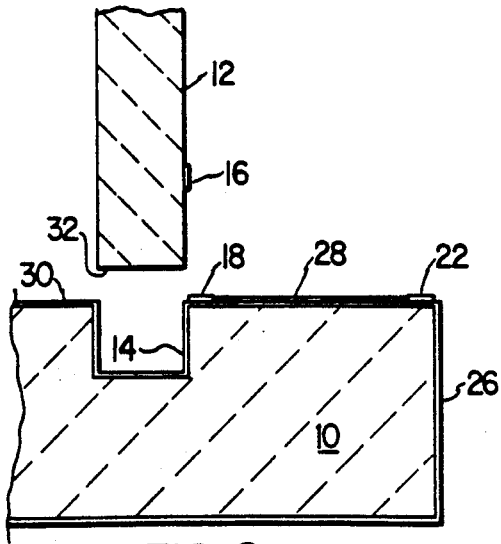
FIG. 2 is an enlarged and partial sectional view of the baseboard chip mount with the chip removed.

Referring now to FIG. 2, there is shown a sectional view of the baseboard chip mount 10 with an integrated circuit chip 12 slightly removed therefrom. The channel 14 is etched or sawed within the baseboard chip mount material so as to be slightly wider than the width of the integrated circuit chip 12. For integrated circuit chips 12 of about one centimeter in height, the channel 14 is formed about 15-20 mils deep. To provide additional vertical support for the integrated circuit chips 12, the channel 14 may be formed deeper. For baseboard chip mounts 10 constructed of silicon, the channel 14 may be anisotropically etched so that the silicon material is removed generally in the downward direction, with only a slight lateral erosion. Other baseboard materials, such as ceramic, silicon carbide, graphite or berylia can be utilized with channels for orthogonally mounting integrated circuit chips thereto.

The baseboard electrical pads 18 and the connector pads 20 are located adjacent the respective edge of the channel 14 and the edge 26 of the baseboard 10. For purposes of clarity, the interconnecting line 28 is shown exposed, but in actuality they may be formed under an insulator. A coating of a high thermally conductive material 30 covers the desired surface area of the baseboard chip mount 10, including the interconnecting line 28. As can be seen in FIG. 2, the thermally conductive material 30 also coats the entire surface of the channel 14. The thermally conductive coating 30 is deposited over the surface of the baseboard chip mount 10 with a thickness which is a function of the amount of heat desired to be removed from the chips 12. The thermally conductive coating 30 is highly effective to draw thermal energy from the integrated circuit chips 12 when the baseboard chip mount 10 has a characteristic low coefficient of thermal conduction. Other than for purposes of electrical insulation, the thermally conductive coating 30 may be dispensed with when the material of the baseboard chip mount 10 is constructed of a high thermally conductive material.

In accordance with one advantage of the invention, the thermally conductive coating 30 comprises high purity silicon carbide (SiC) which has a characteristically high thermal conductivity and low electrical conductivity. Thus, silicon carbide forms an excellent thermal interface between the chip 12 and the baseboard 10, and may be processed to form an excellent electrical insulator to provide isolation between adjacent baseboard pads 18 and adjacent connector pads 22. At room temperature, silicon carbide has a higher thermal conductivity than that of silicon by a factor of about three. Moreover, the thermal conductivity of silicon carbide is better than that of the conventional semiconductor silicon dioxide by a factor of about three hundred. While the use of silicon carbide is preferable as it is compatible with silicon device processing, other thermal conducting films can be used, including; copper, silver, aluminum, or aluminum nitride.

Figure 3:
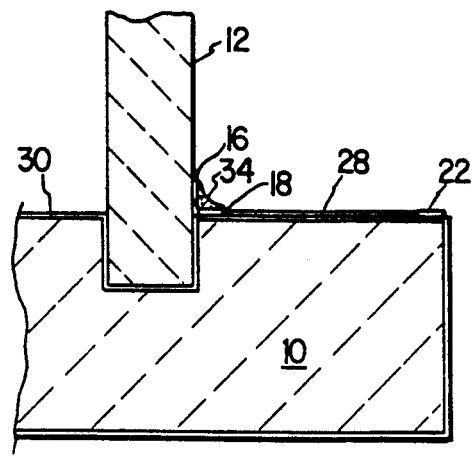
FIG. 3 is an enlarged and partial sectional view of the baseboard chip mount, taken along line 3—3 of FIG. 1.

FIG. 3 illustrates that the chip pad 16 is spaced away from the chip bottom edge 32 a distance approximately equal to the depth of the channel 14. In this manner, when the integrated circuit chip 12 is inserted until it bottoms out in the channel 14, the chip pad 16 is located adjacent the baseboard pad 18. The integrated circuit chip 12 is shown in FIG. 3, fully inserted into the baseboard channel 14. The baseboard channel width is dimensioned to take into consideration the layer of the thermally conductive material 30, such that the integrated circuit chip 12 snugly fits into the channel 14 and heat can be transferred from chip 12 to conductive material 30.

As noted, the integrated circuit chip 12 is fixed electrically, physically and thermally to the baseboard chip mount 10 by forming solder connections 34 between the chip pads 16 and the adjacent associated baseboard pads 18. The solder connections 34 may be formed by depositing a film of solder on contact 16 and/or 18, and reflowing the solder so as to bond the chip pad 16 to the baseboard pad 18. The solder ball may be reflowed by elevating the temperature thereof, such as in conventional reflow solder processes. The combined support of the integrated circuit chip 12 in the channel 14, and the solder bond between each chip pad 16 and its associated baseboard pad 18, provides a rigid support structure for supporting the integrated circuit chip 12 in a free standing orthogonal manner with respect to the baseboard chip mount 10.

Figure 4:
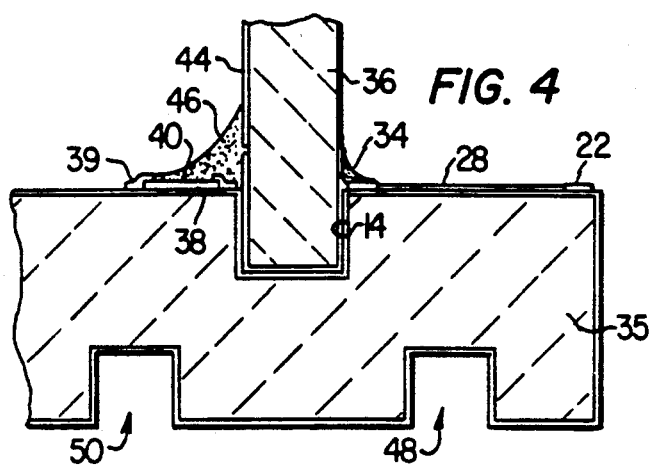
FIG. 4 illustrates an alternative embodiment of a baseboard chip mount, including additional heat dissipation channels on the undersurface thereof, and a contact arrangement for making electrical connection to the backside of the chip.

FIG. 4 depicts an alternate embodiment of a baseboard chip mount 35, wherein an electrical connection is made to a conductive backplane of the integrated circuit chip 36. Channels 48 and 50 are also provided on the undersurface of the baseboard chip mount 35 for increasing the surface area for heat dissipation purposes. The baseboard chip mount 35 of this embodiment has formed thereon an elongate metallic conductor 38 which forms a bus to which electrical connection may be made to the backside of the integrated circuit chips 36. The bus conductor 38 can extend along the length of a channel 14, or can be segmented to form a plurality of backside connections. The bus conductor 38, as well as the chip backplane 44, can be constructed with a solder wettable material, such as nickel or gold. Other conductive materials which can withstand high temperature processing can be used as well.

A conformal coating of a high thermally conductive material, such as silicon carbide or epoxies, is again deposited over the surface of the silicon baseboard chip mount 35. Silicon carbide can be deposited by conventional chemical vapor deposition techniques, at desired thickness. Because of the high temperature processing required for depositing silicon carbide, the materials chosen for the conductor 38 should be of such a type which is compatible with the high temperature. A window 40 is formed in the thermal conductive material on the metal conductor 38, either by preventing the thermally conductive material from being deposited at the window site, or by removing such deposit thereat.

In this embodiment, the integrated circuit chip 36 includes a solderable conductive backplane 44 to which the metal conductor 38 may be electrically connected. A solder fillet 46 is formed in the window between the metal conductor 38 and the backplane conductor 44, thereby providing either power or ground, or a signal connection to the back side of the integrated circuit chip 36. Again, the conductive backplane also functions as a heat sink for transferring heat generated by the chip through the backside electrical connection to the baseboard 10.

Additional channels 48 and 50 can be etched or cut into the backside of the baseboard material to thereby increase the surface area for heat radiation. While such channels 48 and 50 can be located anywhere on the baseboard chip mount 35, such channels are shown in FIG. 4 formed on the underside. The coating of the thermally conductive material 39 may cover the bottoms and sidewalls of the channels 48 and 50.

FIGS. 5-10 illustrate in consecutive order the major steps for fabricating one embodiment of the orthogonal baseboard chip mount according to the invention. The various layers depicted in these figures are, for purposes of clarity, not shown to scale. The base for the chip mount is a silicon wafer 52, preferably of the type having the <110> crystal plane thereof oriented transverse to the top planar face 54 thereof. In the preferred form of the invention, the silicon wafer 52 is about 20-30 mils thick and may be lightly doped with a P or N type semiconductor impurity. The top surface of the silicon wafer 52 is cut with a planar surface area 54. A thick layer of silicon nitride ($Si_3N_4$) 56 is then deposited on the top surface 54 to function as a mask for subsequent orientation dependent etching of the silicon wafer 52. The silicon nitride 56 is on the order of 2,000-3,000 angstroms thick, and deposited by conventional techniques, such as low pressure, chemical vapor deposition.

Next, a much thicker layer 58 of an aluminum and silicon compound is deposited on the silicon nitride 56. The aluminum contains about one percent silicon and is deposited on the silicon nitride 56 with a thickness on the order of about one micron. The aluminum compound layer 58, when patterned, forms the interconnect conductors between solder or connector pads for carrying electrical signals between the integrated circuit chips, and to other circuitry. The silicon nitride layer 56 and the aluminum compound layer 58 are shown in cross section in FIG. 5.

Figure 6:
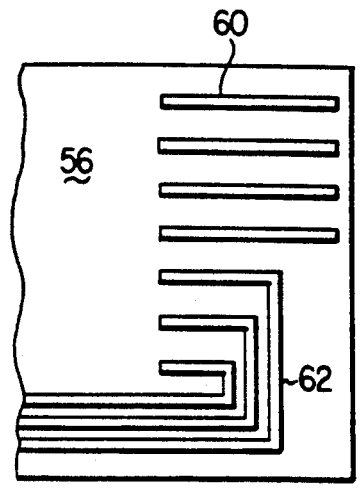
FIGS. 5-10 illustrate the steps in fabricating one embodiment of the baseboard chip mount according to the invention.
Figure 5:
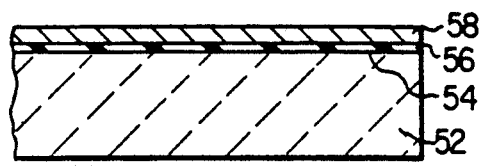

FIG. 6 shows a metalized interconnect conductor pattern 60 and 62 formed by conventional lithography and etching techniques on layer 58. Some of the interconnect conductors 60 provide electrical paths to circuitry external to the baseboard chip mount, while other metalized conductors 62 provide electrical paths to other integrated circuit chips mounted on the orthogonal baseboard chip mount. By using standard silicon device fabrication technology, the conductors can be formed as very thin and narrow lines. Lines as narrow as 1-5 microns can be made. This facilitates a high concentration of lines in a small area.

Figure 7:
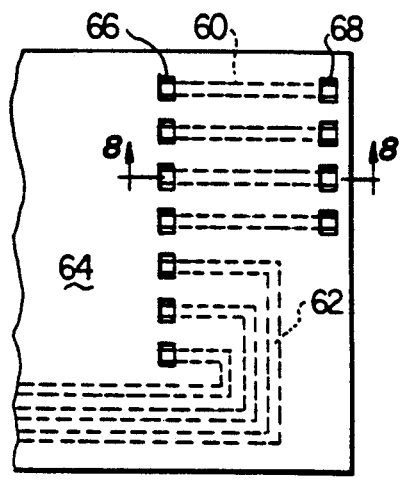

As shown in FIG. 7, an additional layer 64 of silicon nitride is then deposited over the patterned metalized conductors 60 and 62 to provide a mask layer 64. The nitride mask 64 is about 4,000-6,000 angstroms thick and deposited, for example, by a compressive plasma technique. Baseboard electrical pad areas 66 and connector pad areas 68 are opened by conventional techniques within the nitride layer mask 64 to provide for the subsequent formation of connection pads in contact with the terminal ends of the underlying interconnect conductors 60 and 62.

Figure 8:
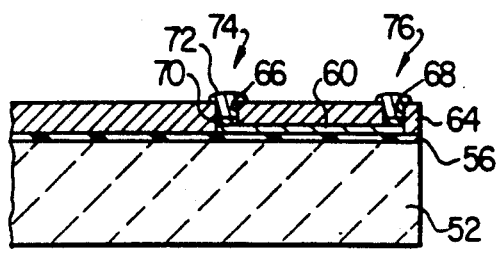

FIG. 8 is a sectional view of the orthogonal chip mount, taken along line 8—8 of FIG. 7. FIG. 8 is shown after a layer of chromium 70 and a layer of copper 72 have been sputtered over the surface of the structure, and patterned to provide oversized surface contact pads 74 and 76. These contact pads extend through areas 66 and 68 in electrical contact with the ends of the underlying interconnect conductor 60. The surface contact pads 74 and 76 correspond to the contacts 18 and 22 of FIG. 1. The chromium layer 70 is about 2,000 angstroms thick for providing a suitable bonding interface for the copper 72 to the aluminum interconnect conductor 60. The copper layer 72 forming the electrical contact surface of the pads 74 and 76 may be about 1-2 microns thick to assure that there is sufficient metallic mass to withstand subsequent soldering or mechanical sliding connector contact.

Figure 9:
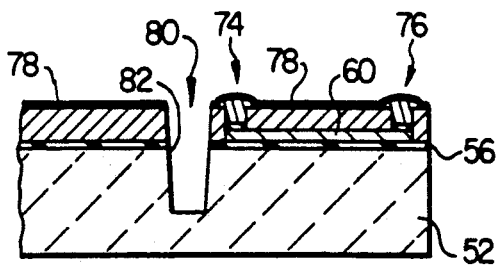

As shown in FIG. 9, an additional 2,000 angstrom chromium layer 78 is then deposited over the surface of the baseboard structure to protect the underlying metalization from a subsequent chemical etch. The chromium layer 78 is then patterned (not shown) and etched with a suitable solution to provide a channel opening 80 through which the underlying silicon can be etched. The layered structure is then mechanically machined or subjected to an orientation dependent chemical etch to form the channel 82. A solution suitable for etching the silicon baseboard 52 in the <110> crystal plane can be an ethylenediamine solution. A channel 82 is thus formed adjacent the baseboard electrical pad 74. The chromium layer 78 is removed by a suitable chemical solution, such as ferricyanide $K_3F_e(CN)_6 + KOH + H_2O$.

Figure 10:
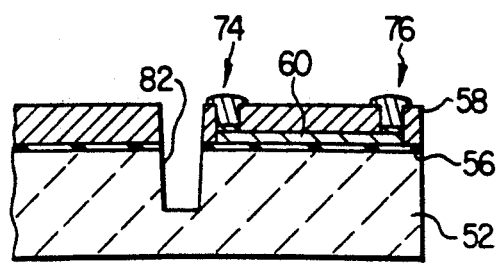
Figure 11:
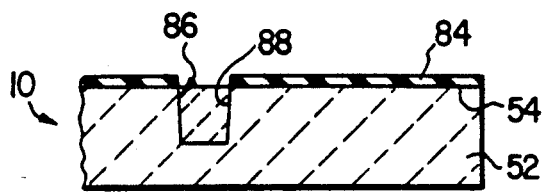
FIGS. 11-16 illustrate the steps for fabricating a baseboard of another embodiment.

FIG. 10 shows the completed baseboard chip mount, wherein an integrated circuit chip can be inserted into the channel 82 and the contacts thereof solder bonded to the baseboard electrical pad 74. Additionally thermal dissipation channels can be formed in a similar manner.

In the event that it is desired to provide a thermally conductive coating of silicon carbide over the surface of the chip mount, additional patterning and material deposition steps may be necessary. For example, a thermally conductive coating, such as silicon carbide can be deposited over the surface of the baseboard, and then opened to expose the top surface of the contact pads 74 and 76. The silicon carbide material is extremely hard, but it can be eroded by conventinal ion etch techniques. When silicon carbide is selected as the material for the thermally conductive coating, the contact pads 74 and 76 should preferably be constructed of a material which can withstand the carbide processing temperature which can exceed 1100° Centigrate. Titanium, tungsten, molly, titanium silicide or polysilicon comprise conductive materials which are compatible with the high temperature processing of silicon carbide. The silicon carbide can be deposited by CVD techniques over various selected surfaces of the baseboard at the various areas or depths, depending upon the amount of thermal energy desired to be dissipated. A one micron thick layer of silicon carbide deposited upon the top surface of the baseboard is effective to dissipate the heat generated by conventional low power metal oxide semiconductor circuits. For bipolar integrated circuit chips, an additional amount of silicon carbide may be deposited on the baseboard chip mount, as required, to dissipate the increased heat generated by such family of circuits.

FIGS. 11-14 illustrate the steps for fabricating another embodiment of the baseboard 10. The same type of silicon wafer 52 is used as the basis for forming the baseboard 10. As before, a layer of silicon nitride 84 is deposited on the top surface of the silicon wafer 52 and patterned to form an area defining a channel 86. In practice, many such areas will be patterned to provide a corresponding number of channels. The silicon wafer 52 is then subjected to an orientation dependent chemical etch to form the channel 86. The etch solution ethylenediamene, for example, provides elongate substantially vertical sidewalls 88. An alternative etch solution for the <110> type of silicon crystal orientation can be 50% KOH and 50% $H_2O$. The channel 86 can also be mechanically machined or sawed. The channels are disclosed as being formed orthogonal to the baseboard 10, however, the chips can be mounted at an angle therewith by cutting, machining or forming the channels in the baseboard 10 at a corresponding angle.

Figure 12:
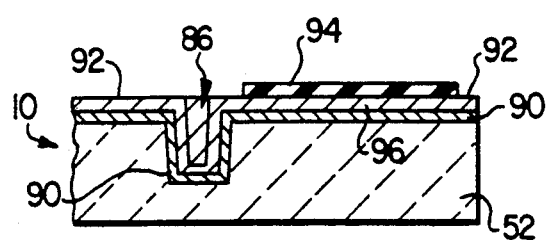

After forming the channel 86 by the orientation etch, the silicon nitride 84 is removed (FIG. 12). The baseboard 10 is then subjected to a chemical vapor deposition process wherein a layer 90 of silicon carbide is deposited on the surface of the silicon wafer 52. The sidewalls 88 of the channel 86, and the bottom thereof, are also covered with the silicon carbide 90. The silicon carbide layer 90 is formed with a thickness of about one micron, using, for example, silicon tetrachloride ($SiCl_4$) and propane. In addition to the thermal advantages of the silicon carbide layer 90, it also strengthens the baseboard 10.

Next, a thick layer 92 of the aluminum and silicon compound is deposited on the silicon carbide layer 90. This is also shown in FIG. 12. An intermediate $SiO_2$ or $Si_3N_4$ dielectric layer may also be used. Again, the aluminum compound layer 92 is deposited to a depth of about one micron. The aluminum compound layer 92 will form the interconnect conductors between the solder pads and the connector pads.

With reference to FIG. 12, an additional layer of silicon nitride 94 is deposited over the aluminum compound layer 92 to form a mask layer defining an underlying interconnect conductor 96. The aluminum compound conductive layer 92 is then exposed to a wet etch solution, wherein all of the aluminum compound is removed, except for the portion 96 underlying the nitride mask 94. The silicon carbide layer 90 is highly resistant to etch solutions, and thus is not affected by the wet chemical etch.

Figure 13:
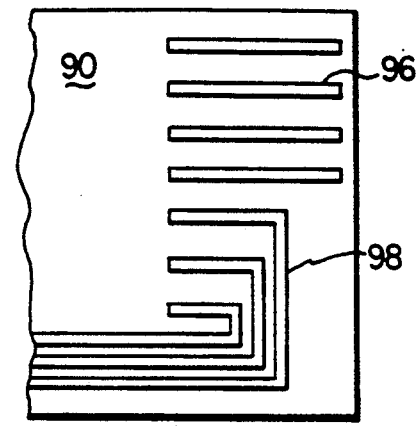
Figure 14:
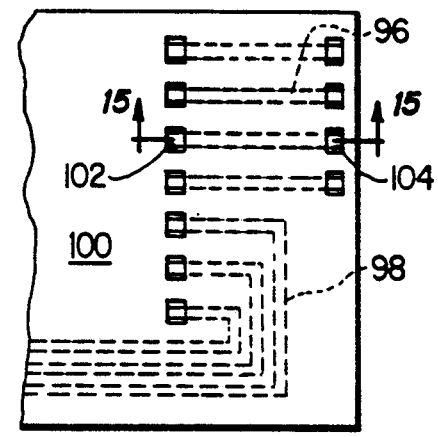

In FIG. 13, there is shown a top view of the metallized interconnect conductor pattern with lines 96 and 98 overlying the silicon carbide layer 90. FIG. 14 illustrates the next step in the baseboard chip mount process, wherein a third silicon nitride mask layer 100 is deposited over the exposed silicon carbide layer 90 and the metal interconnect lines 96 and 98. The mask layer 100 is again about 4,000-6,000 angstroms thick. A baseboard electrical pad area 104 and a connector pad area 106 are opened by conventional methods in the nitride mask 100. This is illustrated in FIGS. 14 and 15.

Figure 15:
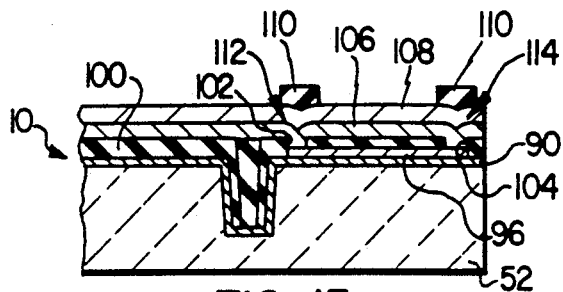

FIG. 15 is a sectional view of the orthogonal chip mount showing the subsequent process steps conducted on the structure of FIG. 14. The interface layer of chromium 106 and an overlying thick layer of copper 108 are sputtered, or otherwise deposited, over the surface of the structure, and patterned by a fourth nitride layer 110 to provide the oversized surface contact pads 112 and 114. The exposed copper layer 108 not covered by the nitride mask 110, and the underlying chromium 106 are subjected to a suitable wet etch which removes all the copper and chromium material not underlying the patterned nitride 110. The contact pads 112 and 114 are thereby isolated and formed. The spaces between the metallic pedestals of copper 108 and chromium 106 are then filled with an insulating layer 116, such as silicon dioxide or silicon nitride.

Figure 16:
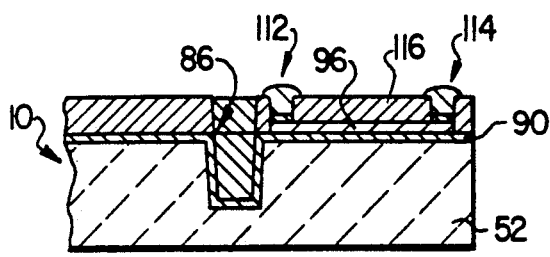

FIG. 16 depicts a portion of the completed baseboard chip mount 10 having an underlying thermally conductive adherent layer 90 formed on the surface of the silicon wafer 52, and into the channel 86. Heat can thereby be transferred from an integrated circuit chip inserted into the channel 86 and transferred by the thermal layer 90 to the silicon chip mount 52.

Figure 17:
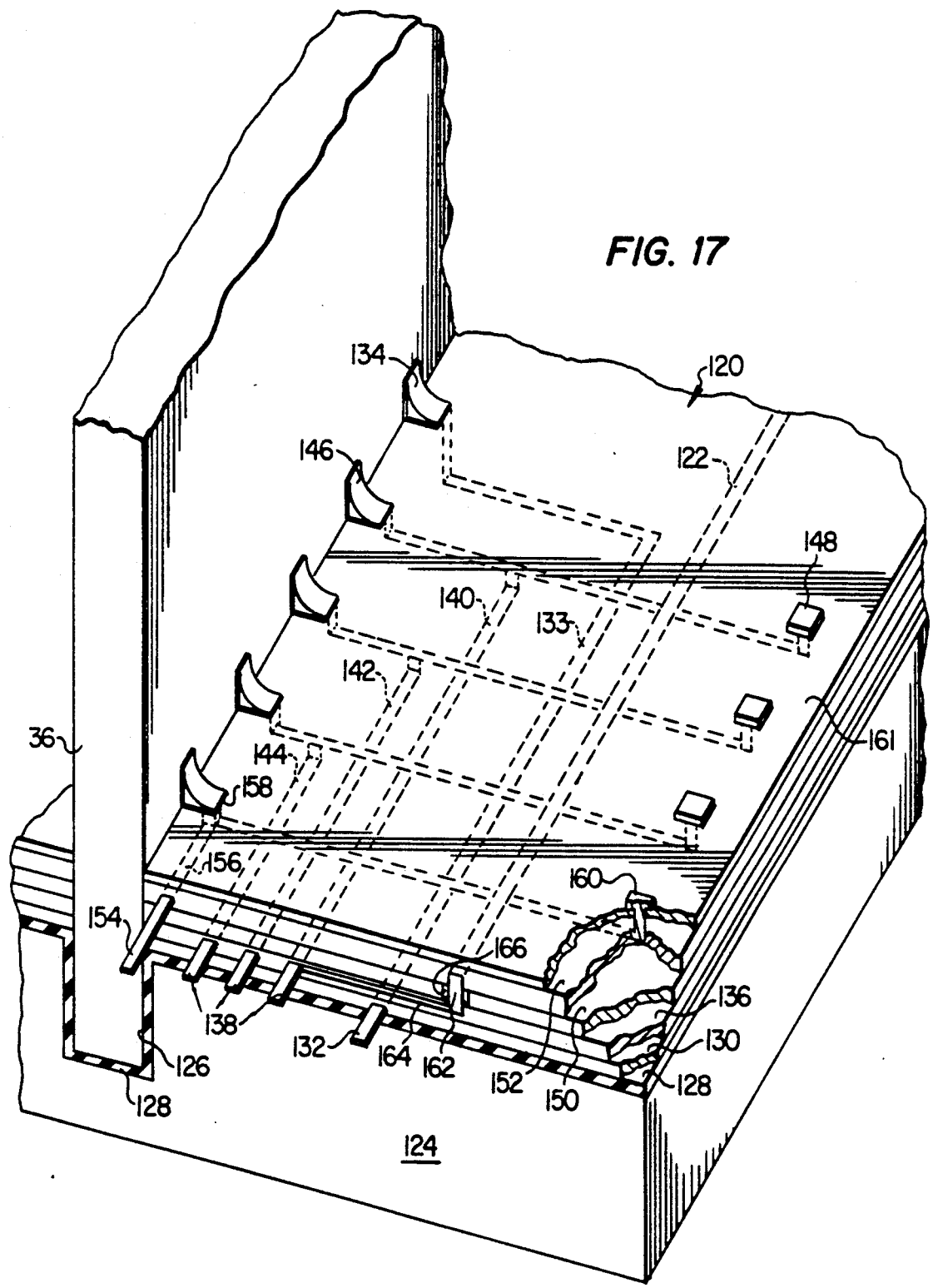
FIG. 17 is a oblique sectional view of yet another baseboard embodiment having plural metallization layers.

A multi-layer chip mount 120 is shown in FIG. 17. This much-enlarged view of another embodiment of the baseboard 120 illustrates plural metallization layers for accommodating a large number of conductive lines in a small volume of space. The electrical interconnection problem can be appreciated in view that a single integrated circuit chip may have 20 to 40 pins. With ten such chips mounted to the baseboard of the invention, an intricate interconnection scheme is necessary.

FIG. 17 shows a multi-layer interconnection scheme for accommodating a large number of interconnecting lines, one shown as reference character 122. The baseboard material 124 can be constructed of a rigid material, such as silicon, and provided with one or more channels 126. Covering the top surface of the baseboard material 124, and the interior surface of the channel 126, is a conformal layer 128 of thermally conductive silicon carbide. An insulation layer 130 is formed over the entire surface of the thermal layer 128. Silicon dioxide or nitride can provide a suitable insulating layer 130 which can be formed according to the standard silicon fabrication techniques.

A first level metallization 132 is deposited or formed within the insulation layer 130, masked and patterned to form the conductor line 133 connected to solder pad 134. The various metallization layers can be formed with conductive materials, including heavily doped polysilicon, aluminum, titanium-tungsten, and other metals. An insulating layer 136 is then deposited over the first metallization layer 132.

A second metallization layer 138 is deposited or formed within the insulation layer 136, masked and patterned to form conductor lines 140, 142 and 144. The conductor lines, for example 140, is connected to baseboard solder pad 146 and connector pad 148.

Deposited on top of insulation layer 136 is a thermally conductive layer 150 of material to provide additional heat dissipation capabilities. The layer can be silicon carbide, or another thermally conductive material. Moreover, the layer 150 can be a thermally conductive metal, such as copper, which can also serve as a power or ground plane for the baseboard 120. When the layer 150 is electrically conductive, contact thereto may be made to the baseboard surface by conventional techniques, such as those used to form connector contact pads 148.

Another insulating layer 152 is deposited over the second metallization 138. Formed on top of or within the insulating layer 152 is a third metallization layer 154. Metallization layer 154 is also masked and patterned to form conductor line 156 connecting baseboard solder pad 158 and to connector pad 160. A top passivation layer 161 of silicon nitride, or similar insulating material, is formed over the entire exposed surface of the baseboard 120.

With the foregoing multi-layer metallization pattern, many conductor lines can criss-cross without being electrically connected together. However, there may be situations in which it is desirable to connect one conductor line to another, such as is shown with conductor line 122 and 140. A vertical conductor element 162 is extended from the second metallization layer 138 to the third metallization layer 154. A lateral conductive member 164 extends transverse to lines 122 and 140, connecting conductor line 140 to the vertical element 162. In this manner, crossovers and other bridging elements can be formed to avoid intersecting conductor lines, and to reach different metallization layers. A jacket of insulation 166 is formed around the vertical element 162, thereby electrically isolating it from the thermally conductive film 150, in the event that such layer is also electrically conductive. The insulating jacket 166 thereby isolates conductor line 122 from any other vertical element which may be used to interconnect different metallization layers together.

The various metallization and insulation layers of the baseboard 120 can be formed using conventional silicon processing technology. This is a technical advantage in that the baseboard 120 can be constructed using the same equipment as used to fabricate conventional integrated circuit chips. The multi-level metallization baseboard 120 also accommodates a large number of interconnect or conductor lines needed to provide electrical signals to the many pins of the integrated circuit chips 36.

From the foregoing, an improved integrated circuit chip mount has been disclosed. According to the principles and concepts of the invention, an integrated circuit baseboard chip mount permits the orthogonal mounting of a plurality of chips thereto. The baseboard chip mount comprises a wafer of silicon with plural channels formed therein, each for holding a chip partially or nearly completely inserted therein. Formed adjacent each channel is a contact pad for soldering to a corresponding pad formed integral to the integrated circuit chip. High density interconnecting conductors are formed in the baseboard chip mount for interconnecting the chips together, as well as for connection to circuits external to the baseboard chip mount assembly.

The baseboarded chip mount of the invention is advantageous in providing a compact packaging scheme which allows multiple integrated circuit chips to be packaged in a space much smaller than packaging schemes heretofore known. An additional advantage of the invention is that with a very compact packaging arrangement, the interconnecting electrical path can be shorter, thereby reducing lead capacitance and maintaining the high-speed operation of the chips. Propogation delays, rise and fall times of the integration circuit inputs and outputs are thus preserved. In addition, conventional semiconductor fabrication techniques and equipment can be used to fabricate the baseboard chip mount of the invention.

The thermal coating on the baseboard chip mount provides an additional advantage by removing the heat energy generated by the electrical operation of the chips. The thermal efficiency of the assemby is thus enhanced.

Therefore, while the preferred embodiment of the invention has been disclosed with reference to several specific baseboard chip mounts, it is to be understood that many changes in detail may be made as a matter of engineering choices without departing from the scope of the invention as defined by the appended claims.

What is claimed is:

1. A multilayer baseboard for mounting a plurality of integrated circuit chips thereto, comprising:
    a baseboard constructed of a semiconductor material, having a planar face and having a plurality of elongate channels formed therein, each for holding an edge portion of an integrated circuit chip;
    a plurality of contact pads formed adjacent each said channel for providing electrical connection to the integrated circuit chip held therein;
    at least two layers of electrically isolated conductor lines, each layer including at least one conductor line; and
    a plurality of vertically disposed conductor lines, selected ones of said vertically disposed conductor lines connecting selected ones of said contact pads adjacent one of said channel with selected ones of said conductor lines in said at least two layers.

2. The multilayer baseboard of claim 1 wherein said plurality of vertically disposed conductor lines interconnect desired conductor lines of one layer with conductor lines of another layer.

3. The multilayer baseboard of claim 1 wherein said conductor lines comprise doped polycrystalline silicon.

4. The multilayer baseboard of claim 2 further including a layer of thermally conductive material disposed adjacent at least one layer of conductor lines.

5. The multilayer baseboard of claim 4 wherein said thermally conductive material is disposed between layers of said conductor lines.

6. The multilayer baseboard of claim 5 wherein said thermally conductive material is electrically conductive, and further including means for insulating said interconnecting means from said electrically conductive material.

7. The multilayer baseboard of claim 1 wherein selected ones of said conductor lines in said at least two layers are further connected so as to connect desired contact pads adjacent one of said channels with desired contact pads adjacent another one of said channels.

8. The multilayer baseboard of claim 1 and further comprising a connector pad located on said planar face adjacent an edge of said baseboard and wherein selected ones of said conductor lines in said at least two layers and selected ones of said vertically disposed conductor lines are interconnected such that said vertically disposed conductor lines are interconnected such that said conductor pad is connected to at least one of said contact pads.

* * * * *